US009034715B2

(12) United States Patent
Wang et al.

(10) Patent No.: US 9,034,715 B2
(45) Date of Patent: May 19, 2015

(54) METHOD AND STRUCTURE FOR DIELECTRIC ISOLATION IN A FIN FIELD EFFECT TRANSISTOR

(71) Applicant: International Business Machines Corporation, Armonk, NY (US)

(72) Inventors: Yanfeng Wang, Fishkill, NY (US); Dechao Guo, Fishkill, NY (US); Darsen Lu, Yorktown Heights, NY (US); Philip J. Oldiges, Lagrangeville, NY (US); Gan Wang, Fishkill, NY (US); Xin Wang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 13/795,776

(22) Filed: Mar. 12, 2013

(65) Prior Publication Data

US 2014/0264591 A1 Sep. 18, 2014

(51) Int. Cl.

| | |
|---|---|
| ***H01L 21/336*** | (2006.01) |
| ***H01L 29/66*** | (2006.01) |
| ***H01L 29/78*** | (2006.01) |
| ***H01L 21/8234*** | (2006.01) |
| ***H01L 21/8238*** | (2006.01) |

(52) U.S. Cl.

CPC .......... *H01L 29/66477* (2013.01); *H01L 29/78* (2013.01); *H01L 29/785* (2013.01); *H01L 29/66772* (2013.01); *H01L 21/823481* (2013.01); *H01L 21/823878* (2013.01); *H01L 29/7848* (2013.01); *H01L 29/7842* (2013.01); *H01L 29/66795* (2013.01)

(58) Field of Classification Search

CPC .................. H01L 29/66772; H01L 29/66795; H01L 21/823481; H01L 21/823878; H01L 29/7842; H01L 29/7848; H01L 29/785

See application file for complete search history.

(56) References Cited

U.S. PATENT DOCUMENTS

| | | | | |
|---|---|---|---|---|
| 6,162,694 | A | 12/2000 | Cheek et al. | |
| 6,995,438 | B1 * | 2/2006 | Ahmed et al. | 257/396 |
| 7,101,763 | B1 | 9/2006 | Anderson et al. | |
| 7,700,416 | B1 | 4/2010 | Clifton et al. | |
| 8,053,348 | B2 | 11/2011 | Anderson et al. | |
| 8,338,259 | B2 | 12/2012 | Wu et al. | |
| 8,362,572 | B2 | 1/2013 | Huang et al. | |
| 2005/0260816 | A1 * | 11/2005 | Orlowski | 438/283 |
| 2006/0131666 | A1 * | 6/2006 | Li et al. | 257/387 |
| 2007/0145487 | A1 * | 6/2007 | Kavalieros et al. | 257/368 |
| 2009/0001468 | A1 * | 1/2009 | Shin | 257/347 |
| 2009/0032880 | A1 | 2/2009 | Kawaguchi et al. | |
| 2010/0127328 | A1 * | 5/2010 | Oh et al. | 257/347 |
| 2011/0193164 | A1 * | 8/2011 | Zhu | 257/347 |
| 2011/0210393 | A1 | 9/2011 | Chen et al. | |
| 2011/0300693 | A1 | 12/2011 | Oh | |
| 2013/0217204 | A1 * | 8/2013 | Park | 438/424 |
| 2014/0191321 | A1 * | 7/2014 | Cheng et al. | 257/347 |

* cited by examiner

*Primary Examiner* — Fei Fei Yeung Lopez

(74) *Attorney, Agent, or Firm* — Joseph P. Abate; Howard M. Cohn

(57) ABSTRACT

A finFET and method of fabrication are disclosed. A sacrificial layer is formed on a bulk semiconductor substrate. A top semiconductor layer (such as silicon) is disposed on the sacrificial layer. The bulk semiconductor substrate is recessed in the area adjacent to the transistor gate and a stressor layer is formed in the recessed area. The sacrificial layer is selectively removed and replaced with an insulator, such as a flowable oxide. The insulator provides isolation between the transistor channel and the bulk substrate without the use of dopants.

9 Claims, 6 Drawing Sheets

METHOD AND STRUCTURE FOR DIELECTRIC ISOLATION IN A FIN FIELD EFFECT TRANSISTOR

FIELD OF THE INVENTION

The present invention relates generally to semiconductor devices, and more particularly to structures and formation methods of fin field effect transistors (FinFETs).

BACKGROUND OF THE INVENTION

With the continuing trend towards miniaturization of integrated circuits (ICs), there is a need for transistors to have higher drive currents with increasingly smaller dimensions. FinFET technology is becoming more prevalent as device size continues to shrink. Silicon-on-insulator (SOI) finFET devices have excellent electrical performance. However, the manufacturing cost is high. Bulk finFETs, where there is no insulator film between the fins and the substrate, have a lower manufacturing cost as compared with a SOI finFET. However, bulk finFETs are prone to leakage currents and device variability which can degrade the electrical performance and adversely affect product yield. It is therefore desirable to have an improved finFET and method of fabrication.

SUMMARY OF THE INVENTION

In one embodiment of the present invention, a method is provided. The method comprises depositing a sacrificial layer on a semiconductor substrate, depositing a top semiconductor layer on the sacrificial layer, forming a polysilicon gate on the top semiconductor layer, performing a silicon recess extending into the semiconductor substrate, thereby forming a substrate recess, depositing a stressor layer in the substrate recess, removing the sacrificial layer to form a void under the top semiconductor layer, and depositing an insulator in the void under the top semiconductor layer.

In another embodiment of the present invention, a semiconductor structure is provided. The semiconductor structure comprises a semiconductor substrate, an insulator region disposed on the semiconductor substrate, a top silicon region disposed on the insulator region, a metal gate formed on the top silicon region, and a stressor region disposed adjacent to the metal gate and recessed below a top level of the semiconductor substrate.

In another embodiment of the present invention, a semiconductor structure is provided. The semiconductor structure comprises a bulk semiconductor substrate, an oxide region disposed on the semiconductor substrate, a top silicon region disposed on the oxide region, a metal gate formed on the top silicon region, and a stressor region comprised of SiGe, wherein the stressor region has a germanium content ranging from about 40 percent to about 50 percent, the stressor region disposed adjacent to the metal gate and disposed below a top level of the bulk semiconductor substrate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted"

Figure 1:
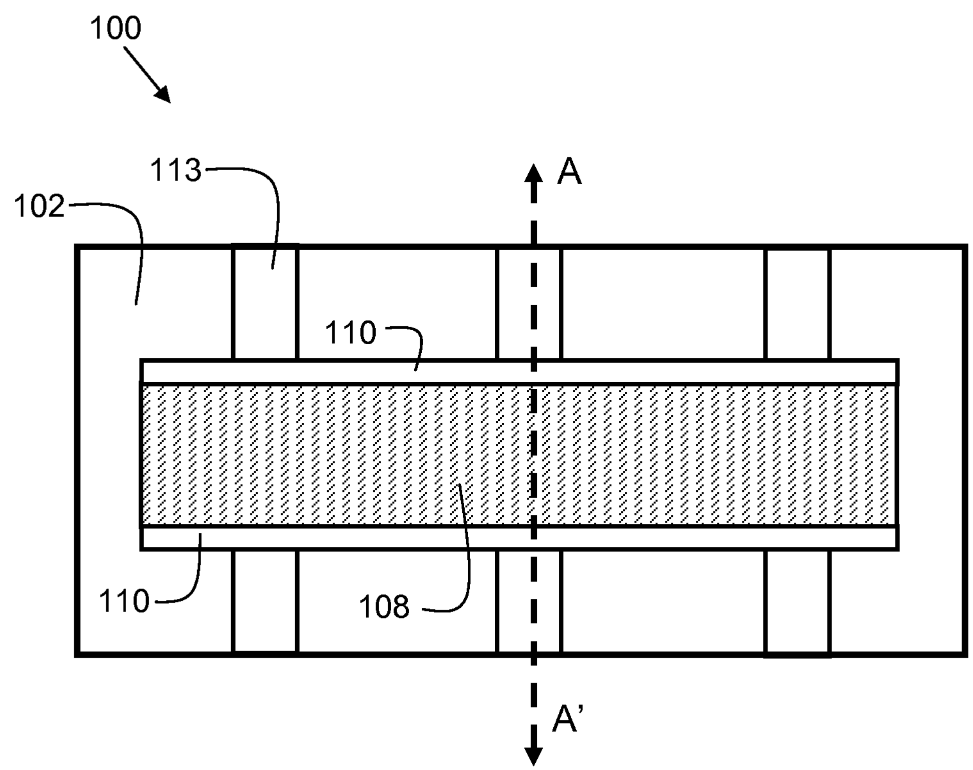

cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a top down view of a semiconductor structure at a starting point for embodiments of the present invention.

Figure 2:
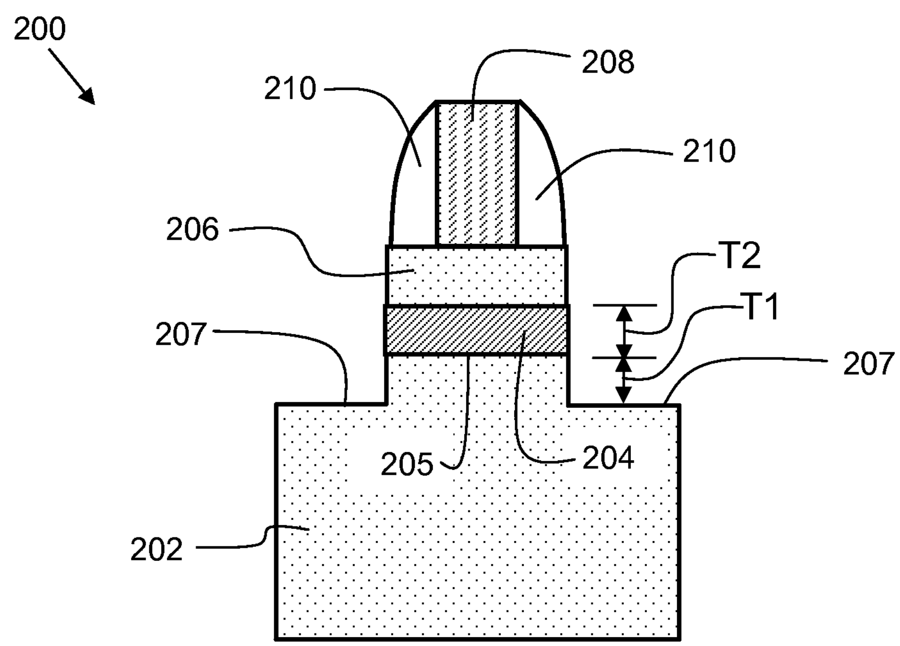

FIG. 2 is a semiconductor structure after a subsequent process step of substrate recess in accordance with embodiments of the present invention.

Figure 3A:
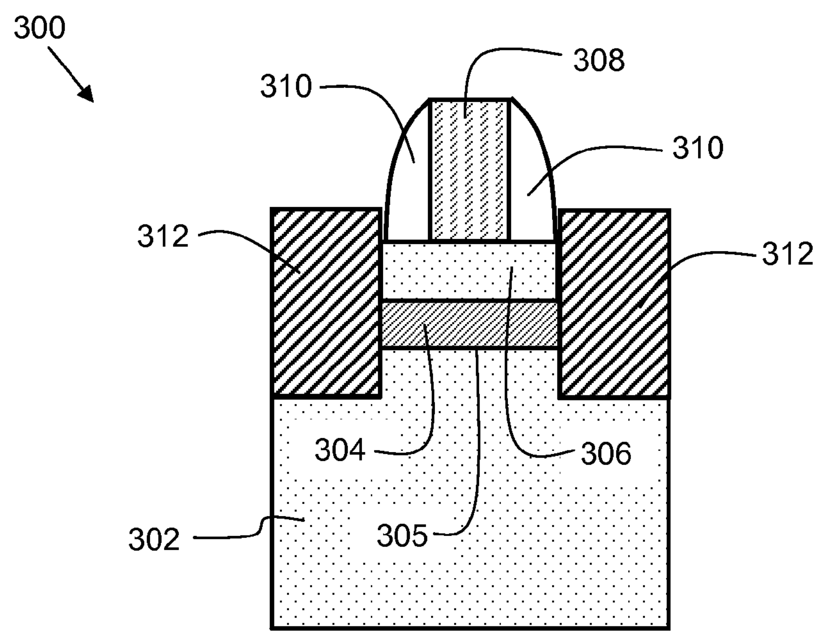
Figure 3B:
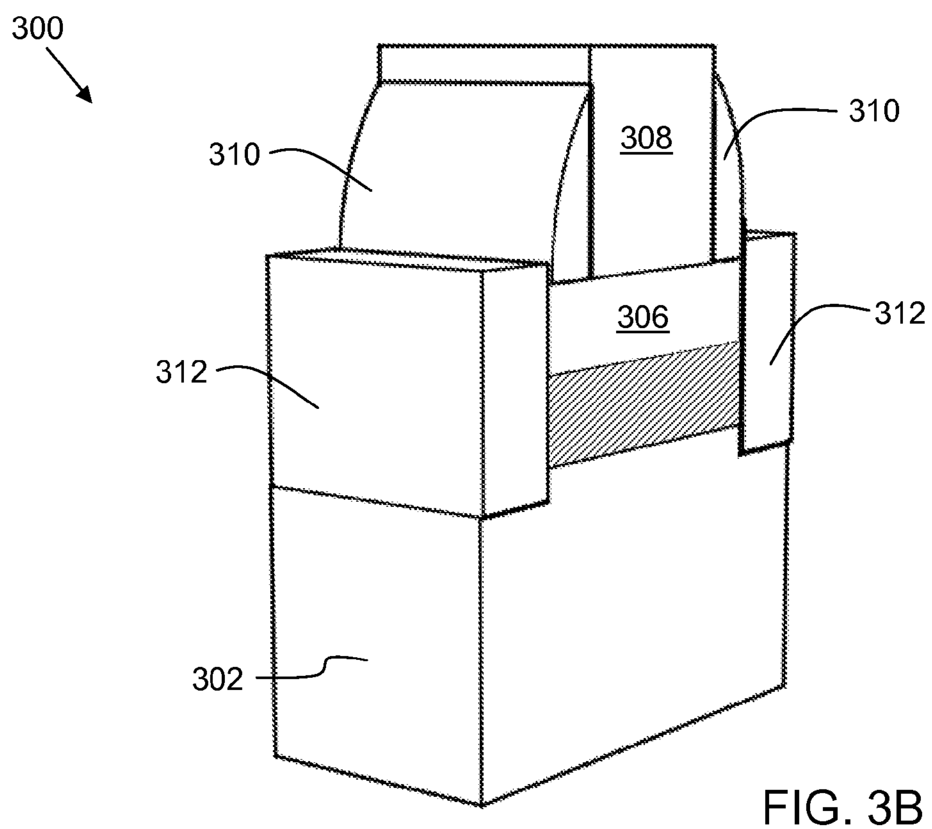

FIG. 3A is a side view of a semiconductor structure after a subsequent process step of forming stressor regions in accordance with embodiments of the present invention. FIG. 3B is a perspective view of the semiconductor structure of FIG. 3A.

Figure 4A:
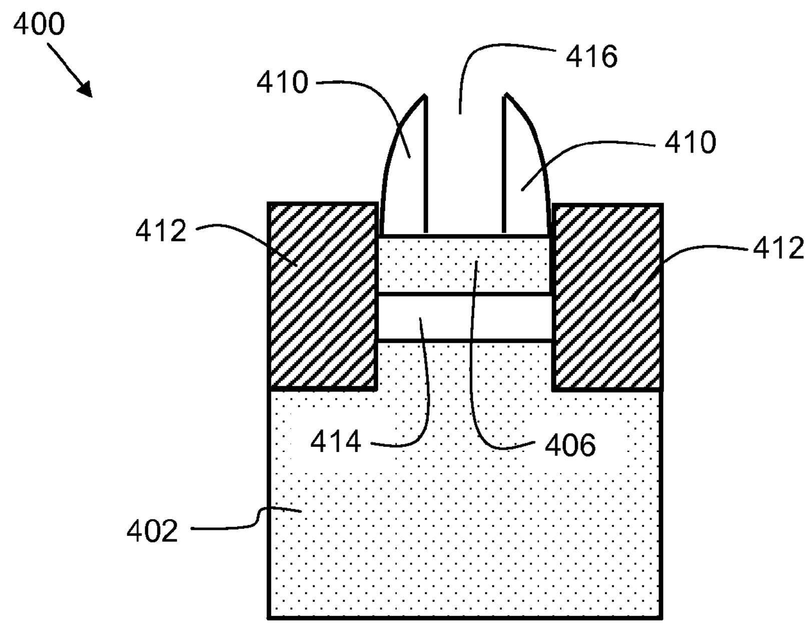

FIG. 4A is a side view of a semiconductor structure after subsequent process steps of polysilicon gate and sacrificial layer removal, in accordance with embodiments of the present invention.

Figure 4B:
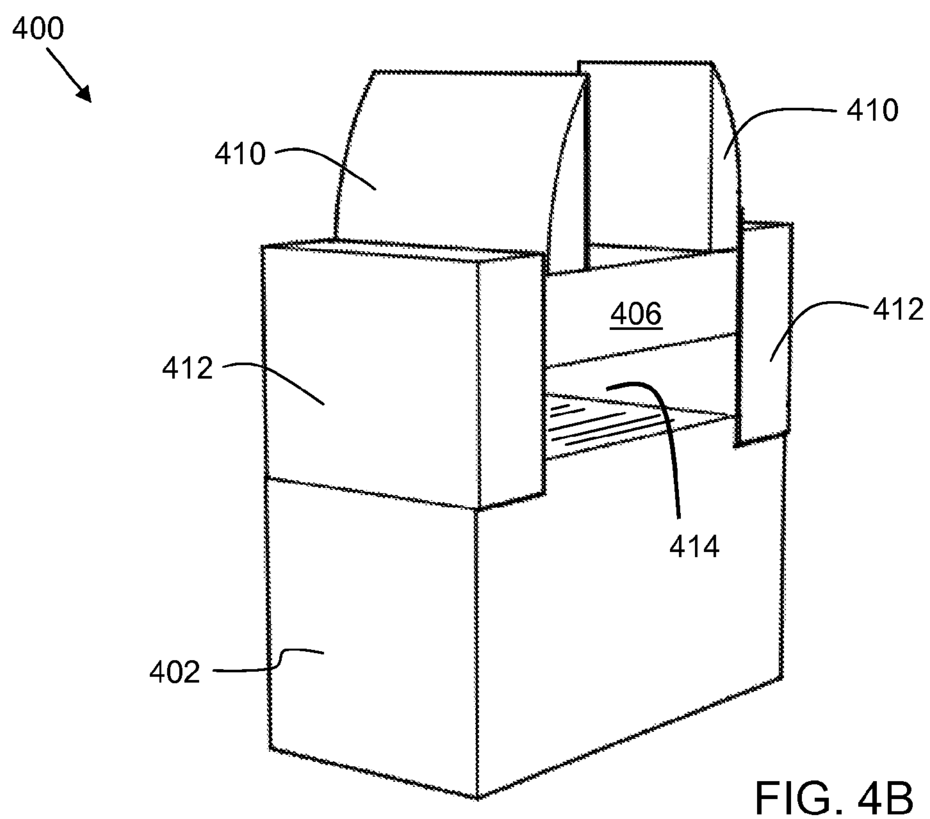

FIG. 4B is a perspective view of the semiconductor structure of FIG. 4A.

Figure 5:
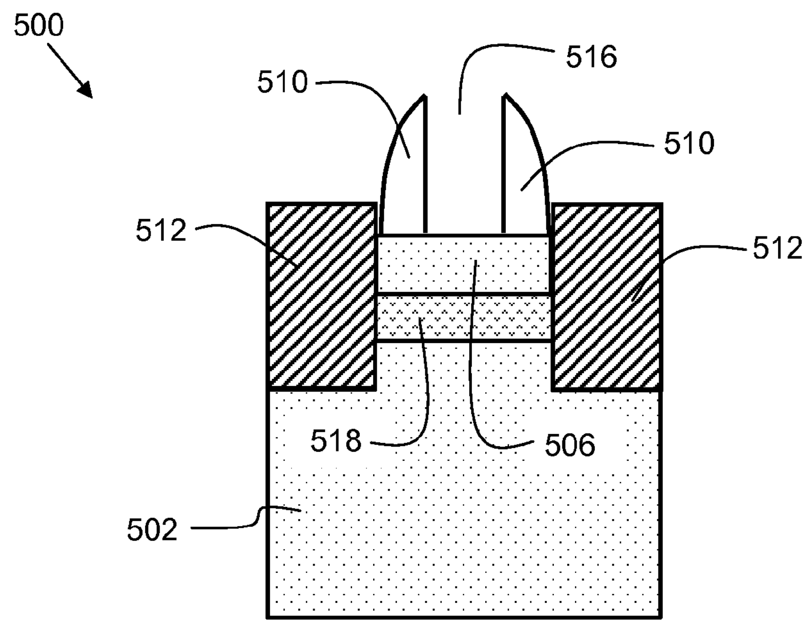

FIG. 5 is a semiconductor structure after a subsequent process step of depositing an insulator, in accordance with embodiments of the present invention.

Figure 6:
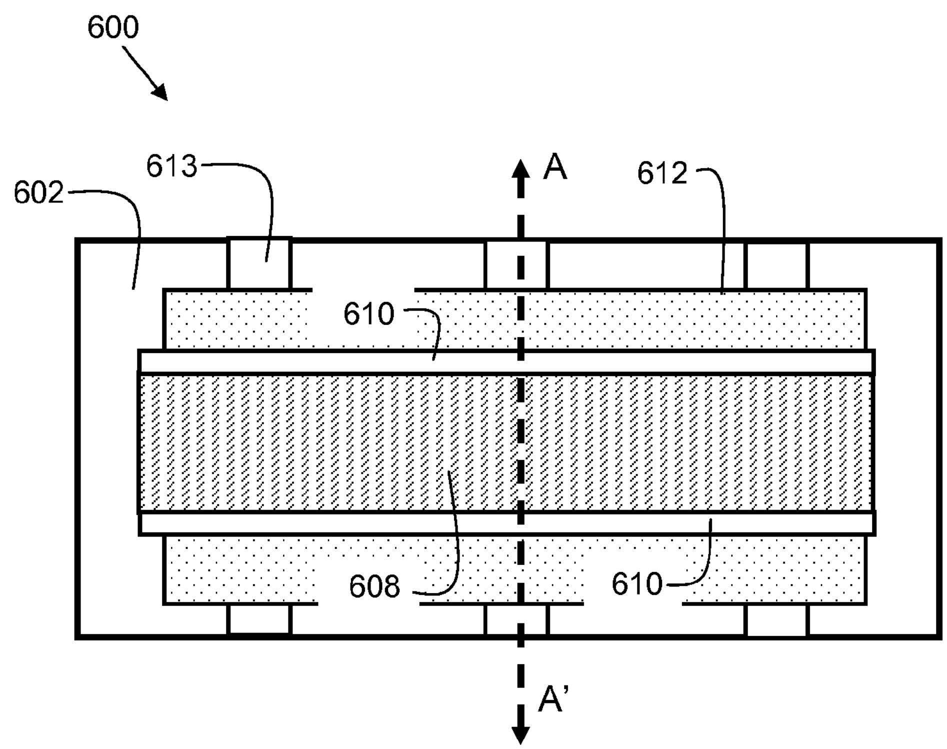

FIG. 6 is a top-down view of a semiconductor structure in accordance with embodiments of the present invention.

Figure 7:
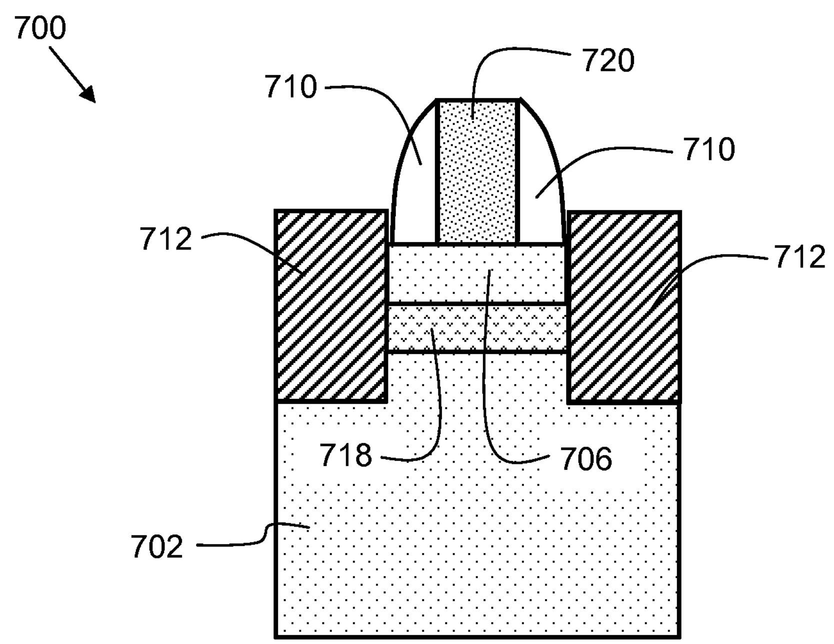

FIG. 7 is a semiconductor structure viewed as a cross section along line A-A' of FIG. 6.

Figure 8:
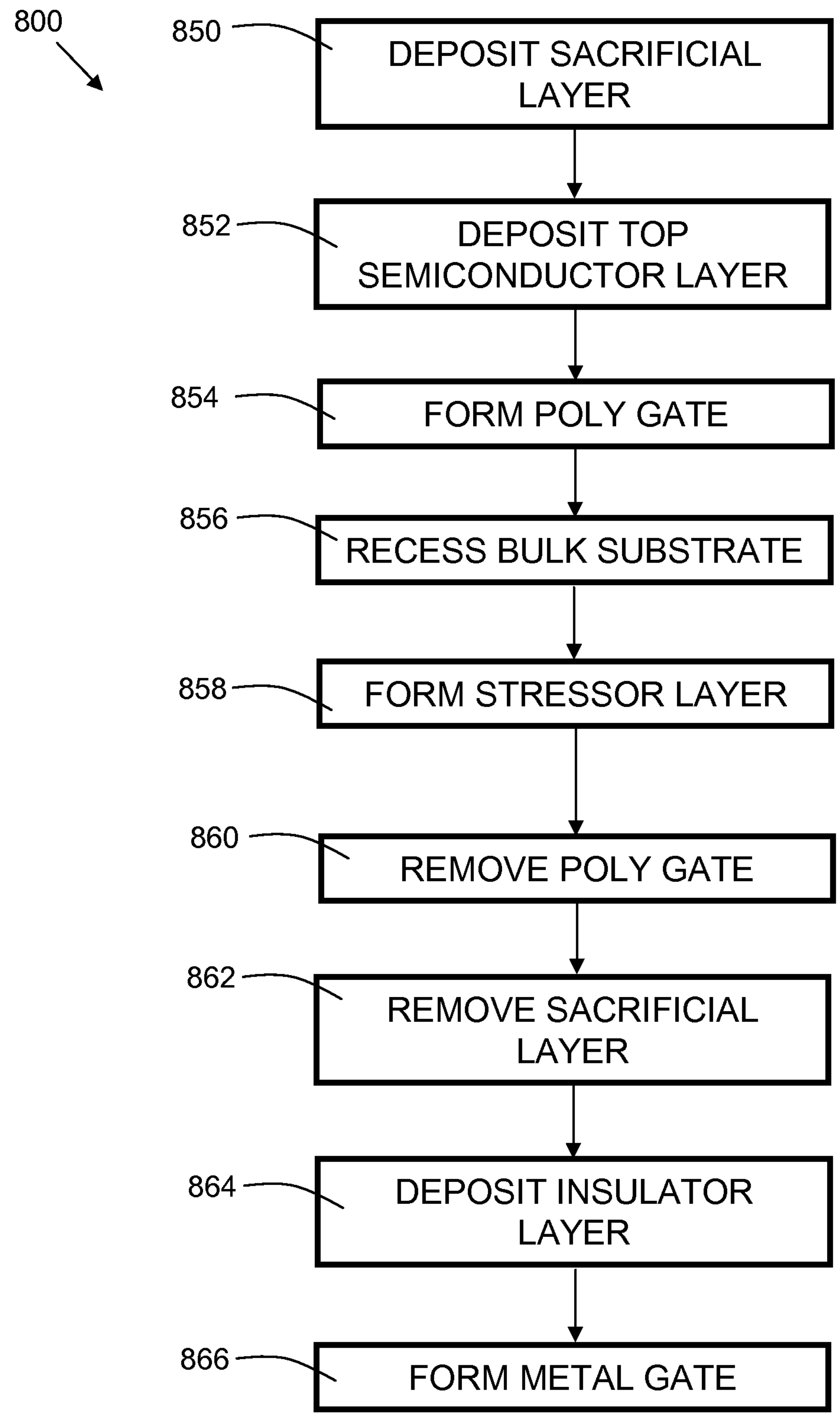

FIG. 8 is a flowchart indicating process steps for embodiments of the present invention.

DETAILED DESCRIPTION

For bulk type FinFETs, achieving good isolation can be challenging. Conventional methods utilize a highly doped layer underneath the channel to form the isolation. This process does not provide good isolation, and furthermore, introduces dopants into the channel that cause device variability and increased random dopant fluctuations (RDF).

Embodiments of the present invention utilize a layer stack comprising a bulk semiconductor substrate, followed by a sacrificial layer, which may include silicon germanium (SiGe), followed by a top silicon layer. A recess extending into the bulk substrate is performed to facilitate formation of stressor regions to enhance carrier mobility. The sacrificial layer is subsequently removed and replaced with an insulator region to provide the benefits of enhanced carrier mobility and less unintended dopants in the transistor channel.

FIG. 1 is a top-down view of a semiconductor structure 100 at a starting point for embodiments of the present invention. A bulk semiconductor substrate 102 serves as the base of semiconductor structure 100. A polysilicon gate 108 is disposed on the semiconductor structure 100. Spacers 110 are formed adjacent to the polysilicon gate 108. In some embodiments, spacers 110 are comprised of nitride, oxide, or a combination of oxide and nitride layers. A plurality of semiconductor fins 113 are arranged orthogonal to the long axis of polysilicon gate 108.

FIG. 2 is a semiconductor structure 200 after a subsequent process step of substrate recess in accordance with embodiments of the present invention. FIG. 2 is a cross section (side) view as viewed along line A-A' of FIG. 1. Line A-A' traverses the gate and a fin. A bulk semiconductor substrate 202 forms the base of semiconductor structure 200. In embodiments, bulk semiconductor substrate 202 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Bulk substrate 202 comprises top surface 205 and recesses 207. Disposed on bulk substrate 202 is sacrificial layer 204. In some embodiments, sacrificial layer 204 may comprise SiGe or silicon carbon (SiC). In some embodiments, sacrificial layer 204 has a thickness T2 ranging from about 10 nanometers to about 20 nanometers. The sacrificial layer 204 is preferably highly selective compared to silicon to facilitate later removal via an etch process. In some embodiments, the sacrificial layer 204 may be formed via epitaxial growth. In other embodiments, chemical vapor deposition (CVD) may be used to form the sacrificial layer 204. Disposed on sacrificial layer 204 is top silicon layer 206. Polysilicon gate 208 is disposed on top silicon layer 206. Spacers 210 are adjacent to polysilicon gate 208. As stated previously, similar elements may be referred to by similar numbers in various figures (FIGs) of the drawing, in which case typically the last two significant digits may be the same. For example, polysilicon gate 208 of FIG. 2 is similar to polysilicon gate 108 of FIG. 1.

As shown in FIG. 2, the bulk substrate is recessed to a depth T1 in recessed areas. In some embodiments, depth T1 ranges from about 5 nanometers to about 10 nanometers. The recesses 207 accommodate a stressor layer that imparts stress to the transistor channel. It is not necessary to go too deep into the bulk substrate 202 since, as distance from the channel under the gate 208 increases, the effects of stress are less helpful to carrier mobility.

FIG. 3A is a side view of a semiconductor structure 300 after a subsequent process step of forming stressor regions 312 in accordance with embodiments of the present invention, and FIG. 3B is a perspective view. In some embodiments, stressor regions 312 may be comprised of SiGe. In cases where the sacrificial layer 304 is also comprised of SiGe, it is then desirable to have a different germanium concentration in the stressor regions 312 than in the sacrificial layer 304, to allow for a selective etch based on germanium content. In some embodiments, the stressor regions 312 are comprised of SiGe having a germanium content ranging from about 40 percent to about 50 percent, and the sacrificial layer 304 is comprised of SiGe having a germanium content ranging from about 10 percent to about 15 percent.

The stressor regions 312 extend below the top surface 305 of the substrate 302, and extend above the top silicon region 306. The stressor regions exert tensile or compressive force on the transistor channel disposed under the gate 308 to increase carrier mobility. In some embodiments, a material other than SiGe may be used for the stressor. In one embodiment, silicon carbon (SiC) may be used for stressor regions 312. In embodiments, the stressor regions 312 may be formed via epitaxial growth.

FIG. 4A is a side view of a semiconductor structure 400 after subsequent process steps of polysilicon gate and sacrificial layer removal, in accordance with embodiments of the present invention, and FIG. 4B is a perspective view. The polysilicon gate is removed to create gate void 416. The sacrificial layer underneath the gate is removed to create intermediate void 414. Other regions of sacrificial layer (not underneath the gate) may be removed as well, or may be masked to prevent removal. In some embodiments, the polysilicon gate and sacrificial layer may be removed in the same etch process. In other embodiments, the polysilicon gate may be removed by a first process, and the sacrificial layer may be removed by a second process. In some embodiments, when the sacrificial layer is comprised of SiGe, a chemical etchant comprised of hydrofluoric acid, hydrogen peroxide, and acetic acid ($HF:H_20_2:CH_3COOH$) is used as a selective etchant of SiGe over silicon.

FIG. 5 is a semiconductor structure 500 after a subsequent process step of depositing an insulator 518, in accordance with embodiments of the present invention. In embodiments, insulator 518 comprises a flowable oxide. The flowable oxide process may include chemical vapor deposition. The flowable oxide occupies the void created when the sacrificial layer (204 of FIG. 2) was removed. The flowable oxide serves to provide dielectric isolation for the semiconductor structure.

FIG. 6 is a top-down view of a semiconductor structure 600. Semiconductor structure 600 is a finFET, and three fins, shown generally as 613 are oriented orthogonal to gate 608. Stressor region 612 may merge the fins 613.

FIG. 7 is a semiconductor structure 700 as viewed along line A-A' of FIG. 6, after a subsequent process step of forming a replacement metal gate 720, in accordance with embodiments of the present invention. One or more thin gate dielectric layers (not shown) may be deposited prior to formation of metal gate 720. The dielectric layer(s) may comprise high-K dielectric layers, such as hafnium oxide, lanthanum oxide, or the like. The metal gate 720 may be a single material, or a stack comprising multiple different materials. In some embodiments, the metal gate 720 may include, but is not limited to, metals such as aluminum, titanium, tungsten, ruthenium, and various alloys thereof. Replacement metal gates (RMG) can provide gate processes with a lower thermal budget, which increases the range of material options for threshold voltage tuning and reliability control. The insulator 718 serves to provide dielectric isolation between bulk substrate 702 and the transistor channel (silicon region 706) and gate 720. As can now be appreciated, the sacrificial layer is replaced with an insulator 718 underneath the transistor channel. This provides channel isolation without the use of dopants for providing isolation. Hence, the disadvantages of dopants for isolation (such as unwanted diffusion) are avoided.

FIG. 8 is a flowchart 800 indicating process steps for embodiments of the present invention. In process step 850, a sacrificial layer is deposited on a bulk semiconductor substrate (see 204 of FIG. 2). In process step 852, a top semiconductor layer (such as a silicon layer) is deposited over the sacrificial layer (see 206 of FIG. 2). In process step 854, a polysilicon gate is formed (see 208 of FIG. 2). In process step 856, the bulk semiconductor substrate is recessed in the area adjacent to the gate (see 207 of FIG. 2). In process step 858, a stressor layer is formed (see 312 of FIG. 3). The stressor layer may be formed via an epitaxial growth process. In process step 860, the polysilicon gate is removed (see gate void 416 of FIG. 4A). In process step 862, the sacrificial layer is removed (see intermediate void 414 of FIG. 4A and FIG. 4B). In process step 864 an insulator is deposited in the intermediate void (see 518 of FIG. 5). This may comprise depositing a flowable oxide via a chemical vapor deposition process. In process step 866 a metal gate is formed in the gate void (see 720 of FIG. 7).

Embodiments of the present invention provide an improved finFET and method of fabrication. A sacrificial layer is formed on a bulk semiconductor substrate. The sacrificial layer may also be a semiconductor material, such as SiGe. A top semiconductor layer (such as silicon) is disposed on the sacrificial layer. The bulk semiconductor substrate is recessed in the area adjacent to the transistor gate and a stressor layer is formed in the recessed area. The stressor layer may also be SiGe, but of a different germanium concentration than the sacrificial layer. The sacrificial layer is selectively removed and replaced with an insulator, such as a flowable oxide. Hence, embodiments of the present invention provide an improved finFET having the advantages of a bulk finFET, such as lower cost and manufacturing simplicity, while having improved isolation and stressor regions extending below the top level of the bulk substrate, providing enhanced carrier mobility.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:

depositing a sacrificial layer on a semiconductor substrate;

depositing a top semiconductor layer on the sacrificial layer;

forming a polysilicon gate on the top semiconductor layer;

forming spacers adjacent to the polysilicon gate;

performing a silicon recess adjacent to the spacers and extending into the semiconductor substrate, thereby forming a substrate recess;

depositing a stressor layer in the substrate recess;

removing the sacrificial layer to form a void under the top semiconductor layer, wherein the void terminates underneath the spacers; wherein the stressor is formed prior to the void; and depositing an insulator in the void under the top semiconductor layer, wherein depositing an insulator in the void under the top semiconductor layer comprises depositing flowable oxide.

2. The method of claim 1, further comprising:

removing the polysilicon gate to form a gate void; and forming a metal gate in the gate void.

3. The method of claim 2, wherein depositing a sacrificial layer comprises depositing SiGe.

4. The method of claim 2, wherein depositing a sacrificial layer comprises depositing SiC.

5. The method of claim 2, wherein depositing a stressor layer comprises depositing SiGe.

6. The method of claim 2, wherein depositing a stressor layer comprises depositing SiC.

7. The method of claim 1, wherein performing a silicon recess comprises recessing to a depth ranging from about 5 nanometers to about 15 nanometers into the semiconductor substrate.

8. The method of claim 1, wherein removing the sacrificial layer is performed with a chemical etchant comprised of hydrofluoric acid, hydrogen peroxide, and acetic acid.

9. The method of claim 2, wherein depositing a sacrificial layer comprises depositing SiGe having a germanium content ranging from about 10 percent to about 15 percent, and wherein depositing a stressor layer comprises depositing SiGe having a germanium content ranging from about 40 percent to about 50 percent.

* * * * *